(12) United States Patent
Johnson et al.

(10) Patent No.: US 6,417,535 B1
(45) Date of Patent: Jul. 9, 2002

(54) VERTICAL INTERDIGITATED METAL-INSULATOR-METAL CAPACITOR FOR AN INTEGRATED CIRCUIT

(75) Inventors: Gregory A. Johnson; Kunal N. Taravade, both of Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/219,655

(22) Filed: Dec. 23, 1998

(51) Int. Cl.$^7$ .............................................. H01L 27/108
(52) U.S. Cl. ....................... 257/306; 257/296; 257/303; 438/381; 438/244
(58) Field of Search ................................ 257/296, 311, 257/532, 535, 301–307; 438/240–253, 396–398

(56) References Cited

U.S. PATENT DOCUMENTS

| | | |
|---|---|---|
| 4,437,139 A | 3/1984 | Howard |
| 4,912,535 A | 3/1990 | Okumura |
| 5,095,346 A | 3/1992 | Bae et al. |
| 5,101,251 A | 3/1992 | Wakamiya et al. |
| 5,142,437 A | 8/1992 | Kammerdiner et al. |
| 5,187,637 A | 2/1993 | Embree |
| 5,195,018 A | 3/1993 | Kwon et al. |
| 5,273,925 A | 12/1993 | Yamanaka |
| 5,381,365 A | 1/1995 | Ajika et al. |
| 5,394,000 A | 2/1995 | Ellul et al. |
| 5,434,812 A | 7/1995 | Tseng |
| 5,494,854 A | 2/1996 | Jain et al. |
| 5,494,857 A | 2/1996 | Cooperman et al. |
| 5,605,857 A | 2/1997 | Just et al. |
| 5,654,581 A * | 8/1997 | Radosevich et al. ........ 257/534 |
| 5,702,990 A | 12/1997 | Just et al. |
| 5,739,579 A * | 4/1998 | Chiang et al. .............. 257/635 |
| 5,742,471 A | 4/1998 | Barbee, Jr. et al. |
| 5,747,382 A | 5/1998 | Huang et al. |
| 5,767,541 A * | 6/1998 | Hanagasaki ................. 257/295 |
| 5,913,141 A | 6/1999 | Bothra |
| 5,915,203 A | 6/1999 | Sengupta et al. |
| 5,925,932 A | 7/1999 | Tran et al. |
| 5,926,359 A * | 7/1999 | Greco et al. ................ 361/311 |
| 5,976,928 A | 11/1999 | Kirlin et al. |
| 5,981,374 A | 11/1999 | Dalal et al. |
| 6,025,226 A * | 2/2000 | Gambino et al. ........... 438/244 |
| 6,069,051 A * | 3/2000 | Nauyen et al. ............. 438/396 |
| 6,057,571 A | 5/2000 | Miller et al. |
| 6,081,021 A | 6/2000 | Gambino et al. |
| 6,100,155 A | 8/2000 | Hu |
| 6,197,650 B1 | 3/2001 | Wu |

FOREIGN PATENT DOCUMENTS

| | | | |
|---|---|---|---|
| JP | 60253265 A | * | 5/1985 |
| JP | 63087761 A | * | 4/1988 |
| JP | 63048856 A | * | 3/1998 |

OTHER PUBLICATIONS

Arjun Kar–Roy, et al, High Density Metal Insulator Metal Capacitors Using PECVD Nitride for Mixed Signal and RF Circuits, 1999.

Peter Van Zant, Microchip Fabrication—A Practical Guide to Semiconductor Processing, Third Edition, pp. 374 and 379.

* cited by examiner

Primary Examiner—Tom Thomas
Assistant Examiner—Donghee Kang

(57) ABSTRACT

A substantially vertical interdigitated plate capacitor, formed in interlayer dielectric material between upper and lower interconnect layers of conductors in an integrated circuit, comprising a lower plate that has at least one U-shaped portion and a horizontal portion connected to an upper edge of the U-shaped portion. The capacitor's upper plate also has at least one U-shaped portion positioned within the interior of the lower plate's U-shaped portion and a horizontal portion connected to an upper edge of each vertically extending leg. The integrated circuit incorporating the capacitor comprises a via connection having a U-shaped layer extending between the conductors of the relatively upper and relatively lower interconnect layers and is formed simultaneously with one of the U-shaped portions of the capacitor plates.

22 Claims, 11 Drawing Sheets

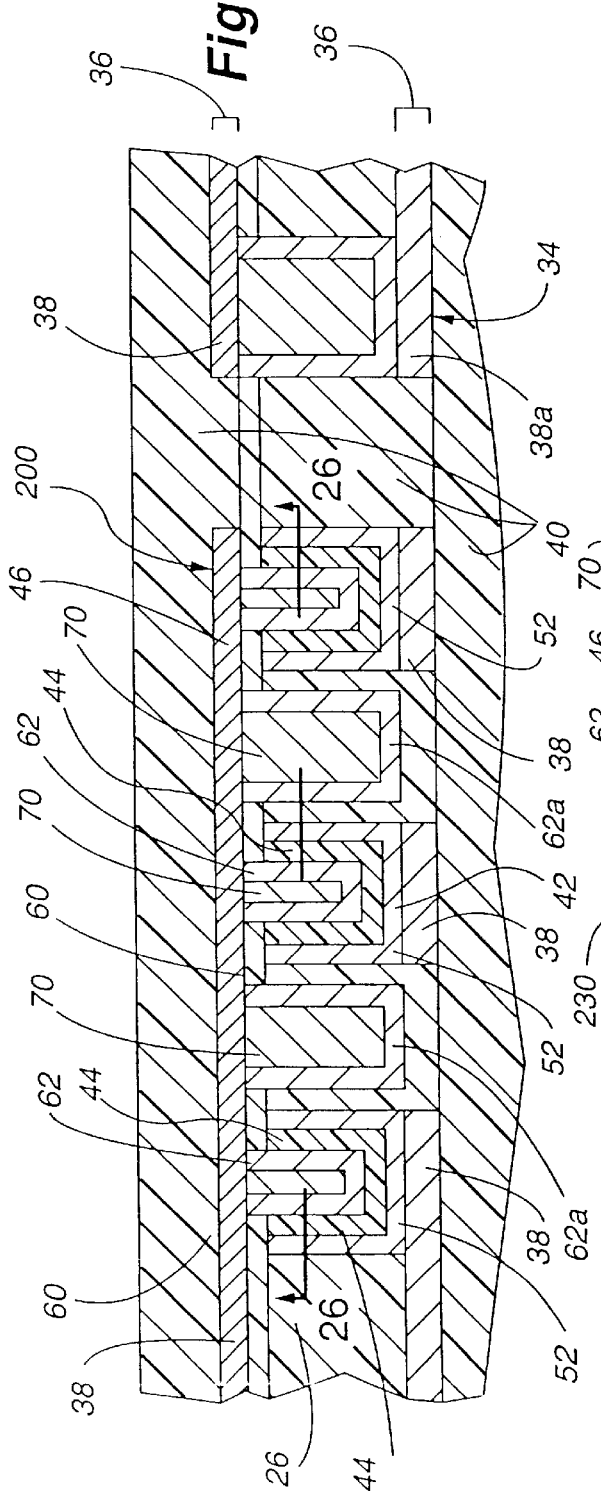
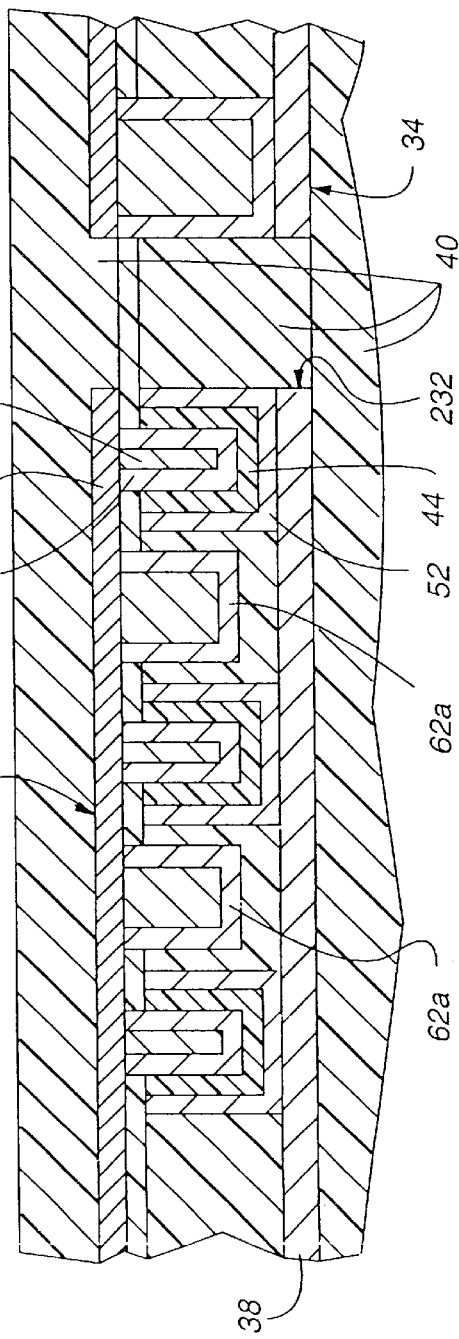

VERTICAL INTERDIGITATED METAL-INSULATOR-METAL CAPACITOR FOR AN INTEGRATED CIRCUIT

CROSS-REFERENCE TO RELATED INVENTION

This invention is related to the invention for a "Method of Forming And Electrically Connecting a Vertical Interdigitated Metal-Insulator-Metal Capacitor Extending Between Interconnect Layers in an Integrated Circuit," described in a concurrently filed U.S. patent application Ser. No. (98-241) and to the inventions disclosed in two previously filed patent applications: Ser. No. 09/052,793 titled "Method of Electrically Connecting and Isolating Components with Vertical Elements Extending Between Interconnect Layers in an Integrated Circuit," filed Mar. 31, 1998 and Ser. No. 09/052, 851 titled "High Aspect Ratio, Metal-To-Metal Linear Capacitor for an Integrated Circuit," filed Mar. 31, 1998. These applications are assigned to the assignee hereof. The subject matter of these applications is incorporated herein by this reference.

This invention relates to capacitors formed in integrated circuits (ICs). More particularly, the present invention relates to vertical capacitors formed between interconnect layers of the IC, and formed by a process that avoids residual accumulation of material following chemical mechanical polishing using well known process steps that are also used to fabricate the IC.

BACKGROUND OF THE INVENTION

Recent efforts in miniaturizing ICs have focused on reducing the space consumed by the circuit components. The ongoing evolution in miniaturizing IC components has resulted in reduced costs and more circuit functionality for a given substrate size and manufacturing cost. For example, only a few years ago spacing between adjoining circuit elements in a typical IC was in the neighborhood of two to three microns. Today, many ICs are being designed at spacing distances as small as 0.35 microns or less. To accommodate narrower spacing, the electrical conductors are reduced in width. The reduction in width is compensated for by increasing the thickness of the conductors to avoid degrading the quality of the signal conducted.

Increasing the thickness of the conductors also requires increases in the thickness of the dielectric insulation material which separates and covers the conductors and components. The thickness of the dielectric must be greater than the height or topology difference among the components, to provide adequate insulation to separate the layers and components of the IC structure from one another. Increases in the thickness of the dielectric material are possible, in part, as a result of advanced planarization techniques such as chemical mechanical polishing (CMP). CMP smooths relatively significant variations in the height of the different components to a planar surface. Smoothing the variable-height topology to a planar surface allows the typical lithographic semiconductor fabrication techniques to be used to form considerably more layers than were previously possible in IC construction. Previously, only one or two layers were typically constructed before the topology variations created such significant depth of focus problems with lithographic processes that any further precision fabrication of layered elements was prevented. However, because of CMP, the number of layers of the IC is no longer limited by the topology. Some present ICs are formed using as many as five or more separate metal or interconnect layers, each of which is separated by a CMP planarized dielectric layer. Consequently, CMP has created the opportunity to incorporate more circuitry on a single substrate in a single IC.

Each interconnect layer comprises many electrical conductors which connect to separate functional components in the IC. The conductors are formed on top of the planarized dielectric layer and extend above conductors positioned in a lower interconnect layer. The conductors of one interconnect layer are electrically separated from each other by dielectric material as are the conductors of separate interconnect layers. In order to connect the conductors of separate interconnect layers, holes or vias are formed in the dielectric material. The vias extend through the dielectric material down to the lower conductor. The vias are then filled with metal or some other conducting material to form a via interconnect. The filler material is typically referred to as a "plug" and thus via interconnects are also referred to as "via plug interconnects." Numerous connection possibilities using via plug interconnects and the multiple interconnect layers may result in substantial unused areas of relatively thick interlayer dielectric material in the IC.

Recent efforts of reducing space consumed in increased density ICs has resulted in orienting some of the components, such as capacitors, vertically. Trench capacitors located in the substrate exemplify one implementation of vertical components, because the parallel plates of the trench capacitor extend vertically. Since the plates extend vertically, less surface area is consumed by the capacitor.

In order to take advantage of the horizontal space saving characteristics, and to take advantage of the unused portions of interlayer dielectric, trench capacitors have been formed in the interlayer dielectric material. Embodiments of an interlayer trench capacitor are discussed in the previously mentioned U.S. Patent Applications titled "High Aspect Ratio, Metal-To-Metal Linear Capacitor for an Integrated Circuit" and "Method of Electrically Connecting and Isolating Components with Vertical Elements Extending Between Interconnect Layers in an Integrated Circuit." As disclosed in these applications, the capacitor comprises a lower U-shaped plate positioned against the walls of a trench in the dielectric material and electrically contacting a conductor of a lower interconnect layer. The capacitor dielectric material is also U-shaped and is positioned within the interior of the lower U-shaped plate. The capacitor dielectric material also extends along the upper surface of the lower U-shaped plate. The upper plate of the capacitor is positioned within the U-shaped opening defined by the capacitor dielectric material. The upper plate contacts a conductor of the upper interconnect layer. Since the capacitor is located above the substrate between interconnect layers, no substrate surface area is consumed by the capacitor. Additionally, owing to the vertical plate orientation, the capacitor does not consume large quantities of horizontal space and can thus be placed in previously unused portions of interlayer dielectric material.

As disclosed in the above-mentioned method patent application, forming the vertical capacitor begins with forming the trench in the layer of interconnect dielectric material. The lower metal U-shaped plate is then formed by uniformly depositing metal in and around the trench and then chemical-mechanical polishing the upper surface to remove metal located above the dielectric layer. Subsequent steps involve depositing the dielectric material and the upper plate metal.

The CMP process step used to create the flush upper ends of the lower metal plate occurs while the trench is open, i.e., not filled. Residual slurry from the CMP process and resist material from the subsequent photolithographic process forms on or catches in the upper edges of the open trench and within the trench. These residual materials are contaminants to subsequent metal application steps (and possibly other steps) and as such can severely interfere with or destroy the effectiveness of the subsequent steps. For example, residual resist will outgas when metal is applied over it. The outgas effect prevents the metal from depositing properly, if at all, thereby resulting in circuit connections which are either unreliable or nonexistent. If the metal does not deposit or adhere properly, an open or unintended circuit situation may occur, degrading the functionality of the IC or capacitor.

The residual materials are extremely difficult to remove completely from the edges of the opening. Moreover, any attempt to remove the materials adds cleaning process steps and may even raise the risk that the other existing circuit components on the IC will be damaged by the cleaning process itself.

It is with regard to these and other considerations and problems that the present invention has evolved.

SUMMARY OF THE INVENTION

An aspect of the present invention is creating a relatively high capacity capacitor having plates positioned between interconnect layers of an integrated circuit. Another aspect of the present invention is forming a vertical capacitor using known process steps without encountering the problems associated with cleaning and removing residual material in and around the edges of an opening in which the capacitor components are formed. Another aspect of the present invention is simultaneously forming a via plug interconnect between the conductors of interconnect layers with the creation of a vertical plate capacitor between those layers of interconnects.

In accordance with these and other aspects, the present invention relates to a substantially vertical interdigitated plate capacitor, formed in interlayer dielectric material between upper and lower interconnect layers of conductors in an integrated circuit. The capacitor comprises a lower plate that has at least one U-shaped portion with vertically extending legs and a horizontal portion connected to an upper edge of each vertically extending leg. Preferably, the capacitor's upper plate also has at least one U-shaped portion with vertically extending legs which is located within the interior of the U-shaped portion of the lower plate and a horizontal portion connected to an upper edge of each vertically extending leg. A substantial majority of the surface area of both plates is formed by the vertically extending legs of each U-shaped portion of each plate. The upper plate may advantageously connect to a conductor of the upper interconnect layer and the lower plate may connect to a conductor of the lower interconnect layer. Also, the conductors of the interconnect layers may be formed of metal, and at least some of the metal from which the conductors of the interconnect layers are formed. Preferably, the U-shaped portion of the upper and lower plates are cylindrical.

The present invention also relates to a capacitor wherein the upper and lower plates each have a plurality of horizontally-displaced U-shaped portions with vertically extending legs, the U-shaped portion of the upper plate located within the U-shaped portion of the lower plate, the upper plate further including a horizontal connection segment connecting to the horizontally-displaced U-shaped portions of the upper plate. The capacitor further comprises a plurality of additional U-shaped portions connected to the horizontal connection segment and positioned between the vertical legs of separate U-shaped portions of the lower plate. All of the U-shaped portions of the lower plate may be commonly connected to a conductor of the relatively lower interconnect layer which may be used to create a horizontal parallel plate capacitance between this conductor and the horizontal lower segment of the additional U-shaped portions.

In accordance with the present invention, the integrated circuit incorporating the capacitor may also comprise a via connection having a U-shaped layer extending between the conductors of the relatively upper and relatively lower interconnect layers and formed simultaneously with one of the U-shaped portions of the capacitor plates.

A more complete appreciation of the present invention and its improvements can be obtained by reference to the accompanying drawings, which are briefly summarized below, to the following detailed description of presently preferred embodiments of the invention, and to the appended claims.

BRIEF DESCRIPTION OF THE DRAWINGS

FIG. 14 is a partial, vertical cross-sectional view of a second embodiment of a vertical interdigitated metal-insulator-metal capacitor extending between interconnect layers and a via plug interconnect, also incorporating the invention.

FIG. 23 is a partial, vertical cross-sectional view of a third embodiment of a vertical interdigitated metal-insulator-metal capacitor extending between interconnect layers and a via plug interconnect, also incorporating the invention.

DETAILED DESCRIPTION

Figure 1:
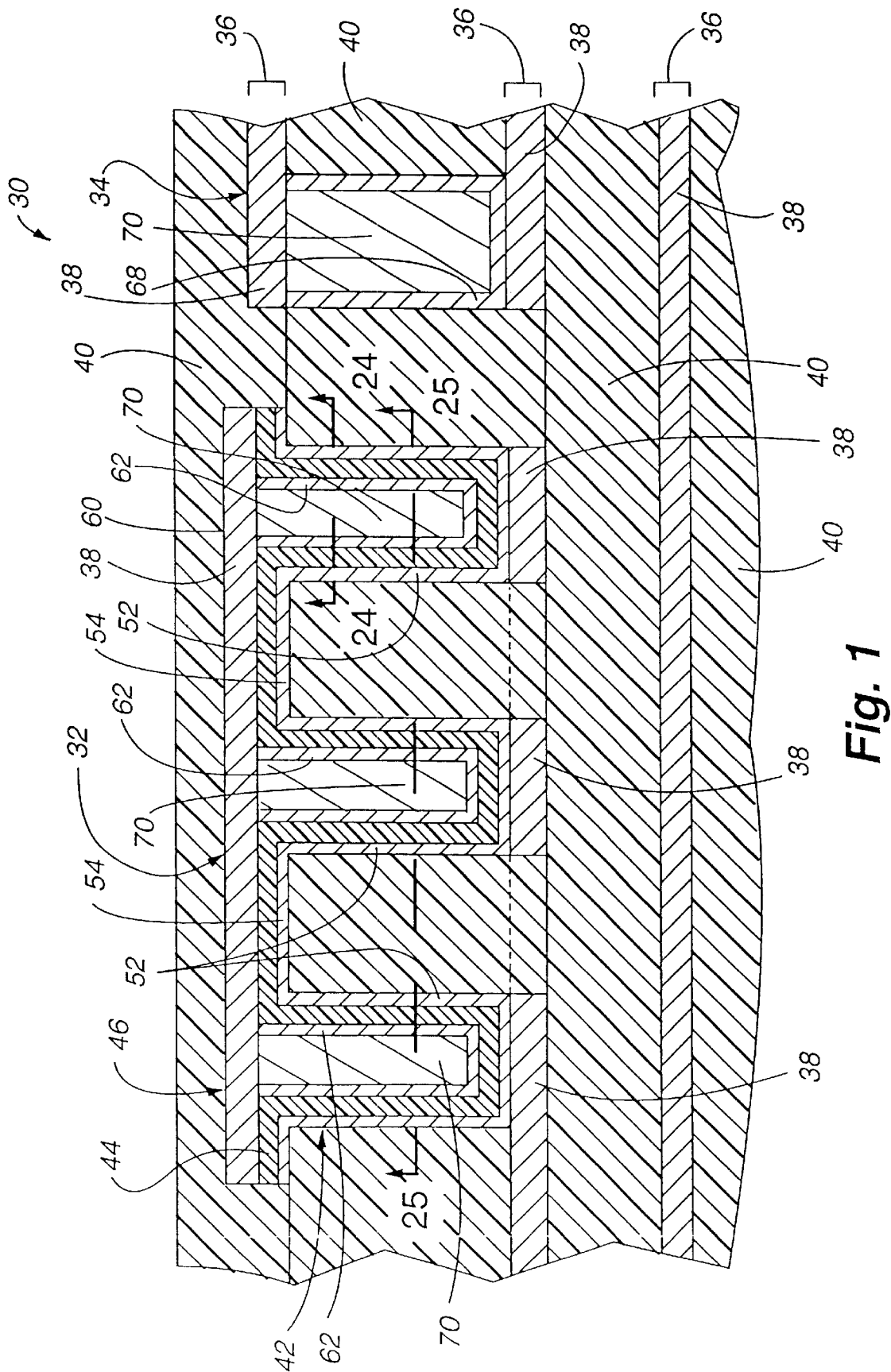
FIG. 1 is a partial, vertical cross-sectional view of an integrated circuit having a vertical interdigitated metal-insulator-metal capacitor extending between interconnect layers and a via plug interconnect, incorporating the present invention.

A portion of an IC 30 incorporating both a vertical interdigitated metal-insulator-metal capacitor structure 32 and a via plug interconnect structure 34 according to the present invention is shown in FIG. 1. The IC 30 is of the type having multiple layers 36 of electrical conductors 38 known as interconnects separated by insulation-type interlayer dielectric material 40. The interconnects 38 of each interconnect layer 36 establish electrical connections between various functional components (not shown) in a substrate (not shown) of the IC 30 and other conductors 38 of other interconnect layers 36. Via plug interconnects 34 are typically used to extend the electrical interconnections in a vertical dimension (as shown) between the conductors 38 of the vertically spaced interconnect layers 36 and the substrate. The interlayer dielectric material 40 provides insulation between the various conductors 38, whether the conductors 38 are in the same interconnect layer 36 or in vertically-spaced interconnect layers. The conductors 38 of one interconnect layer may be slightly higher or lower than other conductors 38 of that same layer 36. In other words, the conductors 38 of each layer 36 need not be exactly coplanar. Consequently, the interlayer dielectric material 40 may vary in thickness between conductors 38 of adjacent interconnect layers 36 resulting in some relatively thick areas of interlayer dielectric 40. In addition, in those locations of the IC 30 where conductors 38 of interconnect layers 36 are not vertically adjacent, the interlayer dielectric 40 may extend continuously vertically for the dimension of two or more interconnect layers 36.

The capacitor structure 32 is formed in the interlayer dielectric material 40. The capacitor 32 comprises an undulating lower metal plate 42, undulating capacitor dielectric material 44 and an upper plate 46 which is separated from the lower plate 42 by the capacitor dielectric material 44. The lower plate 42 electrically contacts at least one conductor 38 in a relatively lower interconnect layer 36 while the upper plate 46 electrically contacts a conductor 38 located in a relatively upper interconnect layer 36. The capacitor dielectric material 44 completely separates the two plates 42 and 46. The lower plate 42, capacitor dielectric material 44 and upper plate 46 are electrically connected within the IC 30 so that in operation the upper plate 46 and the lower plate 42 develop a relative differential in electrical charge.

The undulating lower plate 42 is formed by the continuous connection of a plurality of U-shaped portions 52 and upper horizontal portions 54. Each upper horizontal portion 54 extends across the top surface of the inter-layer dielectric material 40 and connects to an adjacent U-shaped portion 52. As shown in FIG. 1, two horizontal portions 54 connect three U-shaped portions 52. At least one of the U-shaped portions 52 contacts one of the conductors 38 of the lower interconnect layer 36.

The capacitor dielectric 44 is also undulating in shape and separates the upper and lower plates 42 and 46 and may be made of the same material as the interlayer dielectric material 40.

The upper plate 46 comprises a combination of a horizontal metal connection segment 60 and U-shaped metal portions 62 positioned within the interior U-shaped dielectric 44. The metal connection segment 60 electrically contacts each U-shaped portion 62 to form the common upper metal plate 46 of the capacitor 32. The upper connection segment 60 may be a conductor of the upper interconnect layer 36, or the connection segment 60 may be a separate metal layer which connects to at least one conductor (not shown) of the upper interconnect layer 36.

Each U-shaped portion 52 and 62 is formed by laterally opposite and vertically extending legs and by a horizontal bottom portion extending between the lower ends of the vertically extending legs. The upper ends of the vertically extending legs are connected to horizontal portions of the conductive layers. As shown in FIG. 1, the U-shaped portion 62 fits within the interior of the U-shaped capacitor dielectric material 44, and the capacitor dielectric material 44 fits within the U-shaped portion 52.

The capacitance of the capacitor 32 depends on the relative surface areas of the plates 42 and 46, and the thickness and properties of the capacitor dielectric material 44, among other things. The capacitor 32 comprises several portions, each contributing its own capacitance. Since the capacitor dielectric material 44 is continuous and completely separates the upper plate 46 from the lower plate 42, the separate capacitor portions can be considered as separate capacitors connected together. Consequently, the capacitance of the capacitor structure 32 is the sum of the capacitances of its various portions.

The U-shaped portions 52 and 62, and the horizontal portion 54 and the metal connection segment 60 form a plurality of parallel plate capacitor portions. Vertical-oriented parallel plate capacitor portions are formed by the vertical sections (as shown) of the U-shaped portions 52 and 62. Horizontal-oriented parallel plate capacitor portions are formed by the horizontal sections (as shown) of the U-shaped portions 52 and 62 adjacent to the conductor 38 of the relatively lower interconnect layer 36. Other horizontal-oriented parallel plate capacitor portions are formed by the horizontal portions 54 of the lower plate 42 and the connection segment 60 located adjacent to the relatively upper interconnect layer.

Figure 2:
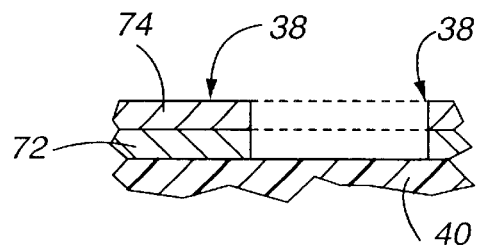
FIG. 2 is a partial cross-sectional view of an interconnect conductor of the integrated circuit shown in FIG. 1.

Each conductor 38 is preferably formed of at least two different metal layers 72 and 74 as shown in FIG. 2. The lower metal layer 72 is formed on the interlayer dielectric material 40 and preferably consists of titanium, titanium nitride, or titanium and titanium nitride. The second metal layer 74 is positioned on top of the first metal layer 72 and is preferably made of copper or aluminum or a combination of both, for example aluminum with approximately 0.5% copper. If the metal layer 74 is formed of primarily aluminum, an anti-reflection coating (not shown) is applied in the conventional manner to the aluminum to prevent light reflection into undesired locations during conventional photo-lithographic semiconductor fabrication processes as is known. Further still, if the metal layer 74 is formed of primarily copper, the copper is typically coated with an encapsulating layer (not shown) to prevent the copper ions from migrating beyond the borders of the layer, as is conventional.

The first metal layer 72 acts as a "barrier metal" against eutectic alloying, that is, the situation where the aluminum compound of metal layer 74 migrates into the dielectric material 40, or into the substrate (not shown) which may result in contact or junction spiking. The use of the barrier metal also reduces electromigration in the aluminum of the metal layer 74 and improves adhesion to the dielectric material. The use of barrier metals in the manner shown in FIG. 2 is conventional. Alternatively, the barrier metal layer 72 could be omitted if the conductive metal of the metal layer 74 comprises a composition of silicon and copper which results in metal that has reduced eutectic alloying and electromigration effects.

Separated from the capacitor structure 32 by inter-layer dielectric material 40 as shown in FIG. 1, the via plug interconnect 34 connects a conductor 38 of a relatively upper interconnect layer 36 and a conductor 38 of a relatively lower interconnect layer 36. The via plug interconnect 34 comprises a U-shaped layer 68 of metal formed within the dielectric 40. The U-shaped layer 68 of metal directly contacts, and thus forms an electrical connection with, the relatively lower interconnect conductor 38. Upper ends of the U-shaped layer 68 directly contact the relatively upper interconnect conductor 38, thus forming an electrical connection between the relatively upper and relatively lower interconnect conductors 38.

Plug material 70 is positioned within the U-shaped layer 68 of the via plug interconnect 34 and within the interior of the U-shaped portions 62 of the capacitor 32. The metal plug material is used to fill the interior spaces within the U-shaped portion 62 and U-shaped layer 68 to provide additional electrical contact between the upper edges of the U-shaped portions 62 and the connection segment 60, and between the upper edges of the U-shaped layer 68 and the upper interconnect conductor 38. Preferably the plug material 70 is made of tungsten and acts as an electrical conductor as described.

The capacitor structure 32 shown in FIG. 1 achieves many advantages over known capacitors. The capacitor 32 is advantageously placed between the interconnect layers 36 and has a higher capacitance than known capacitors since it comprises both vertical and horizontal parallel plate capacitor portions that are combined. The capacitor structure 32 can be formed at the same time using the same materials and process steps as those used to form the via interconnect 34. Moreover, as will be apparent from the following discussion, the formation of the capacitor structure 32 does not involve the use of chemical mechanical polishing steps while openings are present that would result in the accumulation of problematic residual materials that are difficult or impossible to remove during the fabrication process. Details concerning the process steps of the present invention are described below in sequence in conjunction with FIGS. 3–13.

Figure 3:
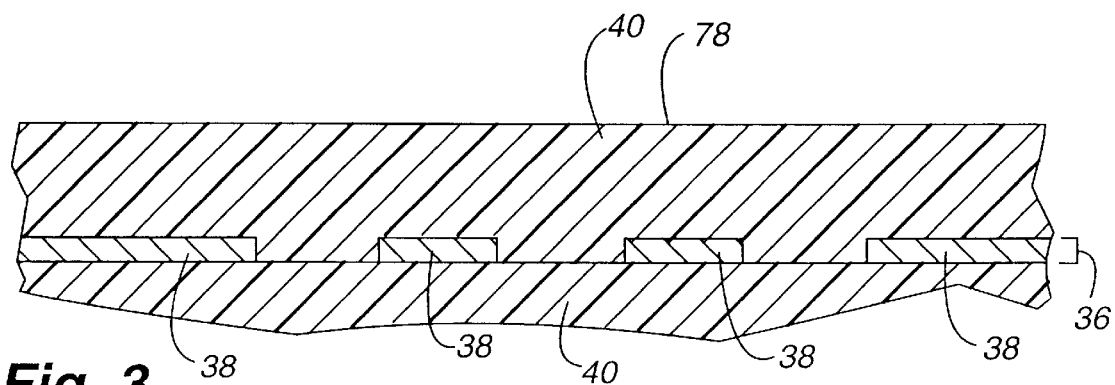
FIGS. 3–13 are cross-sectional views showing a sequence of steps involved in fabricating the capacitor, via plug interconnect and interconnect layer conductors shown in FIG. 1, according to the present invention, with FIGS. 7A–7C showing alternative process steps at an intermediate stage of the sequence.

The process of forming the capacitor structure 32 generally begins at the stage shown in FIG. 3 where the conductors 38 of the lower interconnect layer 36 have been formed on a layer of interlayer dielectric material 40 using conventional deposition, lithographic and etch techniques. Insulation-type, interlayer dielectric material 40 is deposited in the area between the conductors 38 as well as on top of the conductors 38. The inter-layer dielectric material 40 is preferably formed using plasma-enhanced chemical vapor deposition (PECVD) or chemical vapor deposition (CVD). The upper surface 78 of the material 40 is typically uneven. Consequently, following deposition of the material 40, a CMP process step is preferably used to smooth the upper surface 78. The amount of material 40 deposited is sufficient to accommodate the vertical dimensions of the capacitor structure 32 (FIG. 1) following the removal of the top surface 78 by the CMP process step.

Figure 4:
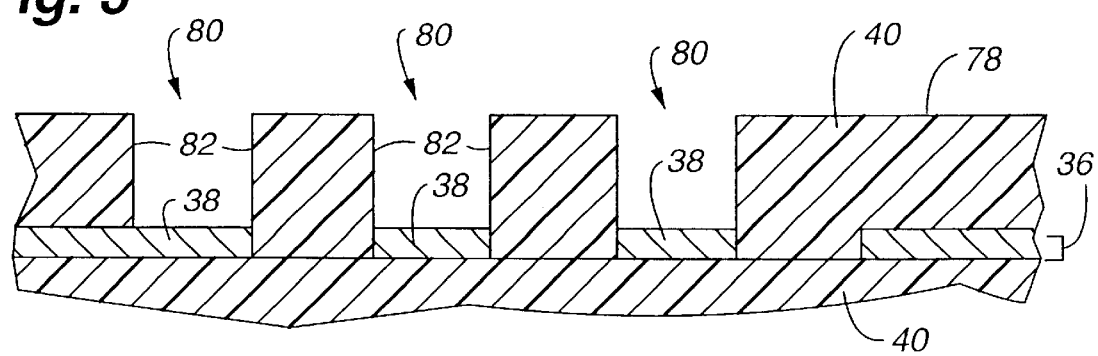

Following the deposition of the interlayer dielectric 40, capacitor vias 80 are formed as shown in FIG. 4. Essentially, the vias 80 are holes in the interlayer dielectric 40 that have substantially vertical side walls 82 extending from the upper surface 78 of the dielectric material 40 down to the upper surface of the metal conductors 38. The vias 80 in the interlayer dielectric 40 are preferably formed by conventional lithographic and etching steps.

Preferably the vias 80 are etched by a conventional reactive ion etching process or a plasma etching process. The etching proceeds very directionally without isotropic deviation. The metal interconnect conductors 38 are exposed at the lower ends of the vias 80. After the vias 80 have been completed as shown in FIG. 4, the cured resist material (not shown) placed on upper surface 78 and used to protect the dielectric material 40 is removed from the upper surface 78 of the inter-layer dielectric 40. Although the via plug interconnect 34 (FIG. 1) is created by first forming a via, the via for the via plug interconnect 34 is not created simultaneously with the capacitor vias 80.

Figure 5:
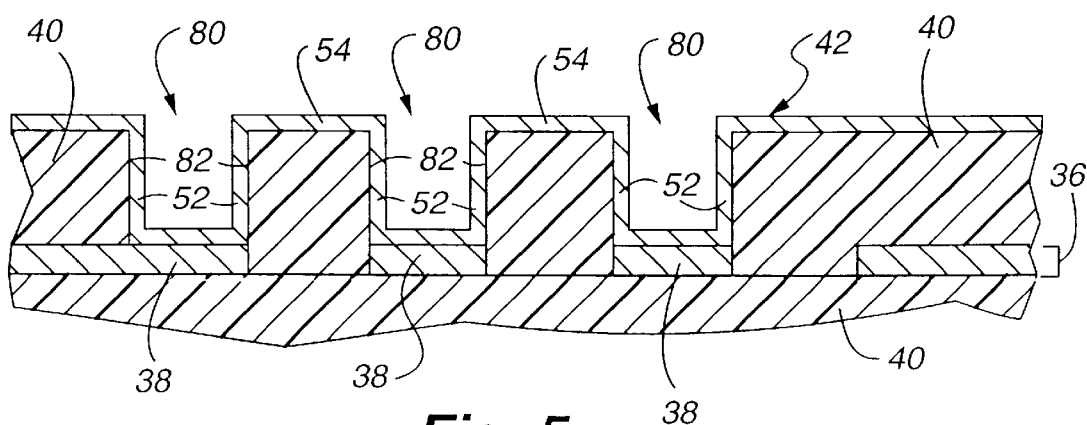

The continuous capacitor plate 42, is next formed in the capacitor vias 80 and on the upper surface 78 of the interlayer dielectric material 40, as shown in FIG. 5. The metal capacitor plate 42 is preferably formed by sputtering, CVD, PECVD or other physical vapor deposition of metal on the side walls 82 of the vias 80, on the lower interconnect 38 exposed at the lower end of the vias 80 and on the top surface 78 of the interlayer dielectric material 40. The deposition process is self-aligning and thus forms the Lower metal plate 42 of essentially uniform thickness.

Preferably, the metal from which the lower plate 42 is formed is of at least some of the same type of metal from which the lower interconnect conductors 38 are formed, thereby establishing a sound electrical contact and connection between the lower plate 42 and the conductors 38. Preferably the lower plate 42 is made of titanium, titanium nitride, or titanium and titanium nitride and is thus similar to the barrier metal 72 (FIG. 2). Forming the lower plate 42 with the same process and substance as the conductors 38 of the interconnect layers 36 greatly simplifies the process because no different process steps are required beyond those necessary to form the conductors 38. Thus, no additional complexity in the IC fabrication process is introduced. The reliability of the IC fabrication process is also preserved because of the fewer number of separate processing steps which must be accomplished. If desired or for specific purposes, the metal from which the lower plate 42 is formed may be different from the metal(s) of the conductors 38 of the interconnect layers 36.

Figure 6:
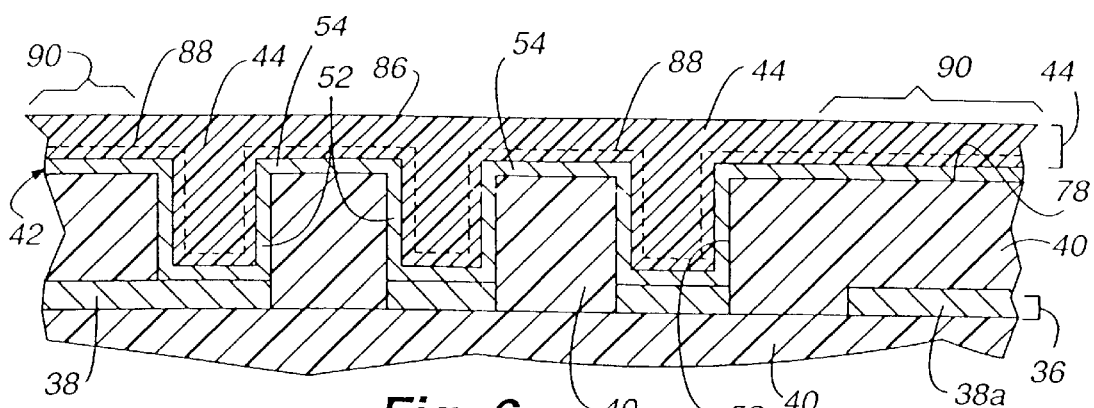

Once the lower metal plate 42 is formed, capacitor dielectric material 44 is deposited over the metal plate 42, as shown in FIG. 6. The capacitor dielectric material 44 covers the entire surface of the lower plate 42, occupies the open interior within the U-shaped portion 52 in the vias 80 (FIG. 5), and covers the upper horizontal portions 54 of the metal plate 42 formed on top of the dielectric material 40. Preferably, PECVD or CVD is used to form the capacitor dielectric material 44. Using these surfaces upon which to deposit the capacitor dielectric material 44 simplifies the process, because other processing steps are not required to isolate or expose these surfaces. The PECVD or CVD process continues until the space within the U-shaped portions 52 of the lower plate 42 are filled and a upper surface 86 of the capacitor dielectric material 44 is formed. The top surface 86 may not be even, and a CMP step is preferably used to level the top surface 86.

Preferably, at a predetermined time in the capacitor dielectric deposition process, an etch-stop layer 88 is formed in the dielectric material 40. The etch-stop layer 88 is created by adjusting the capacitor dielectric deposition environment, changing the chemical characteristics of the dielectric material 44. After the etch-stop layer 88 is formed, the capacitor dielectric deposition process continues in its original form, depositing dielectric material 44 having the same chemical makeup as that deposited before the etch-stop layer 88 is formed. The resulting etch-stop layer 88 is a very thin, uniform layer embedded within the capacitor dielectric material 44.

Figure 7A:
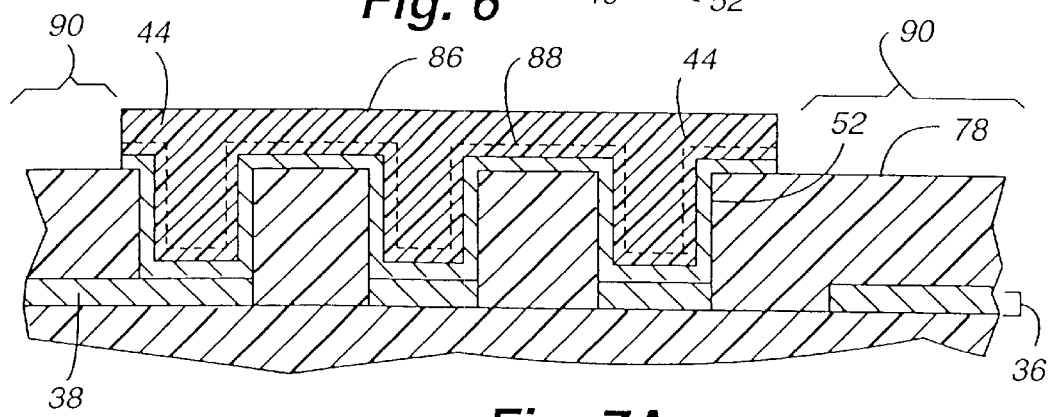

The lower plate 42 and the capacitor dielectric 44 are formed on the surface 78 of interlayer dielectric material 40 in areas where metal and dielectric may not be desired, e.g. in areas 90 above a lower interconnect conductor 38a at the location for the via plug interconnect 34, as is shown by comparing FIG. 1 and FIG. 6 and therefore this material is removed. First, a conventional CMP step may be used to remove excess dielectric material above the U-shaped portions 52. Next, selective portions of both the capacitor dielectric material 44 and the lower plate 42 are uniformly reduced or removed using a photolithographic/etch step from those areas 90, as shown in FIG. 7A. The photolithographic/etch step exposes the upper surface 78 of the interlayer dielectric material 40. Using the photolithographic/etch step to remove the substances 42 and 44 does not result in excess residual material forming in any openings since the openings are completely filled with the capacitor dielectric material 44 prior to this last step.

Figure 8:
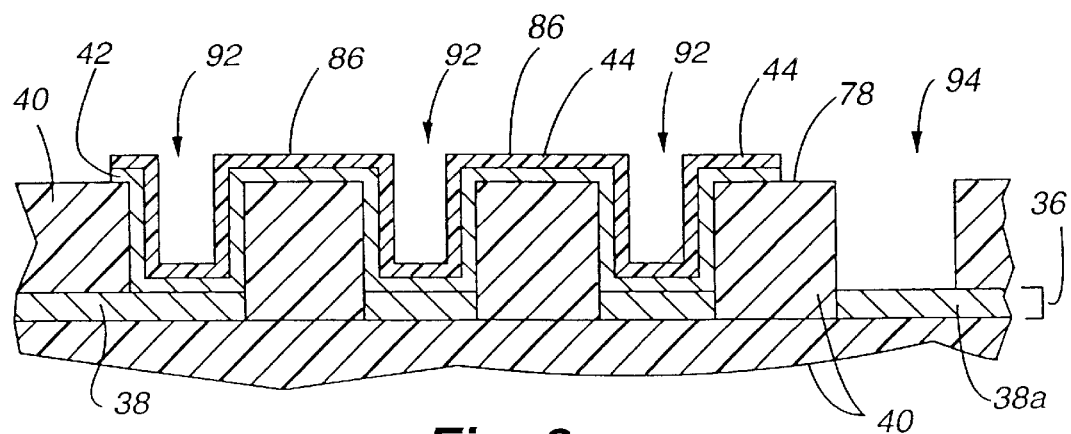

Following the photolithographic/etch step, openings 92 are etched in the capacitor dielectric material 44 as shown in FIG. 8. A via plug interconnect via 94 is also etched in the interlayer dielectric material 40. Similar photolithographic and etch steps used to create the vias 80 (FIG. 4) are used to create the openings 92 and via 94. The etch process proceeds very directionally without isotropic deviation. The etch extends downward from the upper surfaces 78 and 86, into the interlayer and capacitor dielectric materials 40 and 44, respectively, creating the via 94 and the openings 92.

The anisotropic etch process extends the via 94 down to the metal interconnect conductor 38a as shown in FIG. 8, exposing the conductor 38a at the lower end of the via 94. Preferably, the via 94 is slightly over-etched, to ensure that the lower interconnect conductor 38a is sufficiently clear and exposed.

With respect to the openings 92, the etch process proceeds downward until reaching the etch-stop layer 88 (FIGS. 6 and 7A). Since the etch-stop layer 88 (FIG. 7A) is a different chemical composition it resists further etching and thus effectively prevents the openings 92 from reaching down to the metal plate 42. The location of the etch-stop layer 88 thus defines the thickness of the capacitor dielectric 44.

If the etch-stop layer 88 (FIGS. 6 and 7A) is not used, then the etch process must be stopped at a predetermined time before the capacitor dielectric material 44 has been removed down to the lower plate 42. Stopping the etch process before exposing the lower plate 42 ensures that a layer of capacitor dielectric material 44 remains above a lower horizontal portion of the U-shaped portion of the lower plate 42. Because the etch process forms openings 92 (FIG. 8) simultaneously with the via 94, it is important to make sure the depth of interlayer dielectric material 40 above the interconnect conductor 38a (FIG. 6) is less than or equal to the desired depth of the subsequently formed openings 92 (FIG. 8). If too much material exists above the interconnect conductor 38a such that stopping the etch process at a predetermined time to satisfy the depth requirements of the openings 92 does not sufficiently expose the interconnect conductor 38a, the via 94 will not be adequately formed.

Figure 7B:
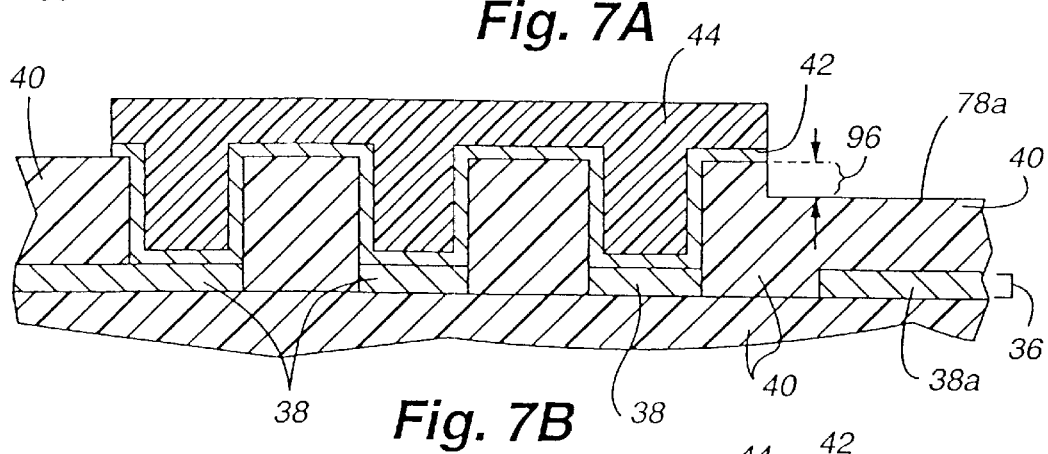

To establish the proper heights of material 40 above the interconnect 38a relative to the depth to which the openings 92 (FIG. 8) are to be formed may require that the surface 78a (FIG. 7B) of the interlayer dielectric above the lower interconnect 38a be lowered a predetermined distance 96 as shown in FIG. 7B. Lowering the surface 78a the distance 96 is achieved by an additional photolithographic/etch step. The distance 96 which the surface 78 is lowered depends on the desired depth of the openings 92 (FIG. 8), as explained. Consequently, when the via 94 is etched simultaneously with the openings 92, the via 94 etching process proceeds sufficiently downward to reach and expose the interconnect 38a as shown in FIG. 8 when the openings 92 are formed.

Figure 7C:
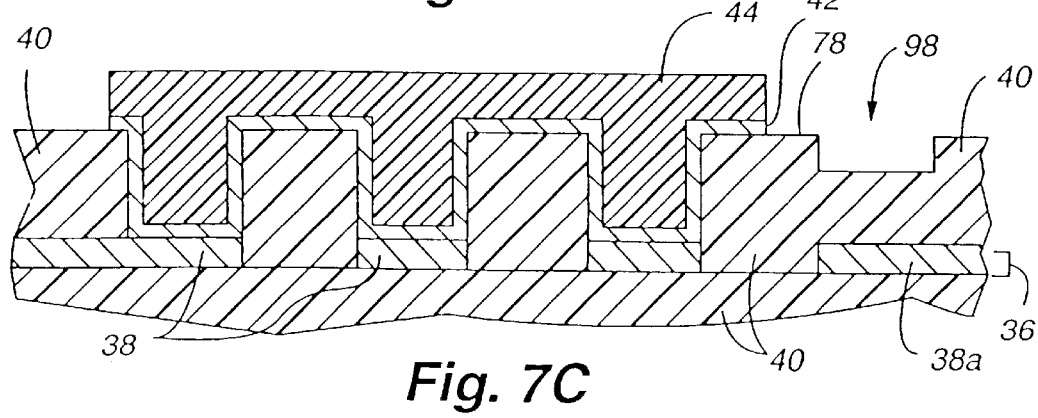

Alternatively, if the etch stop layer 88 (FIGS. 6 and 7A) is not used, or if the surface 78a is not lowered using a photolithographic/etch step (FIG. 7B), then the via 94 (FIG. 8) is formed using two sequential photolithographic/etch steps. Under these circumstances, the first etch step partially etches the via by forming an opening 98 as shown in FIG. 7C. While the opening 98 is being formed, the capacitor and interlayer dielectric materials 44 and 40, respectively, are protected with resist (not shown). Thereafter, a second photolithographic/etch step is used to form the openings 92 (FIG. 8). While the openings 92 are etched, the remainder of the via 94 is simultaneously etched from the opening 98 (FIG. 7C), exposing the lower interconnect 38a, resulting in the configuration shown in FIG. 8. Since the via 94 was partially formed in the step shown in FIG. 7C, the second etch step, shown in FIG. 8, can be stopped at a time when the resulting openings 92 reach a desired depth simultaneously with the via 94 reaching the conductor 38a.

Yet another method of forming the separate openings 92 and 94 involves a photolithographic/etch step to completely etch either the openings 92 or the via 94 and then using another photolithographic/etch step to completely etch the other via 94 or the openings 92. This method requires the removal of resist material from the previously formed openings after the second etch process and therefore this method may not be preferred.

Figure 9:
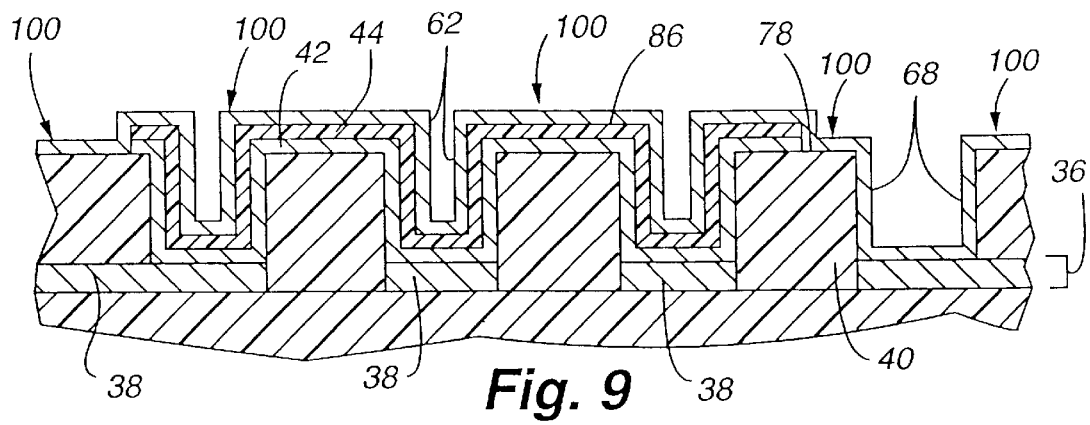

Following the formation of the openings 92 and the via 94, the process flow continues with the deposition of a layer 100 of metal, which eventually forms the upper plate 46 (FIG. 1), on top of the interlayer dielectric material 40 and the capacitor dielectric 44, as shown in FIG. 9. The metal layer 100 partially fills the interior of the newly created openings 92 and the via 94 (FIG. 8). The metal layer element 100 is preferably formed by sputtering, PECVD, CVD, or other physical vapor deposition techniques. The exposed surfaces of the dielectric materials 40 and 44 are used as a self-aligning surface for the deposition of the metal layer 100. As a result, the metal layer 100 coats the interior walls and lower surface of the openings 92 and the via 94 (FIG. 8)and extends across the upper surfaces 86 and 78 as shown in FIG. 9.

The metal layer 100 is relatively uniform, having a substantially equal thickness throughout. Preferably, the metal of the layer 100 is of at least some of the same type of metal from which the lower plate 42 is formed. Forming the metal layer 100 with the same process and substance as the lower plate 42 greatly simplifies the process because no different process steps are required. Thus, no additional complexity in the fabrication process is introduced.

Figure 10:
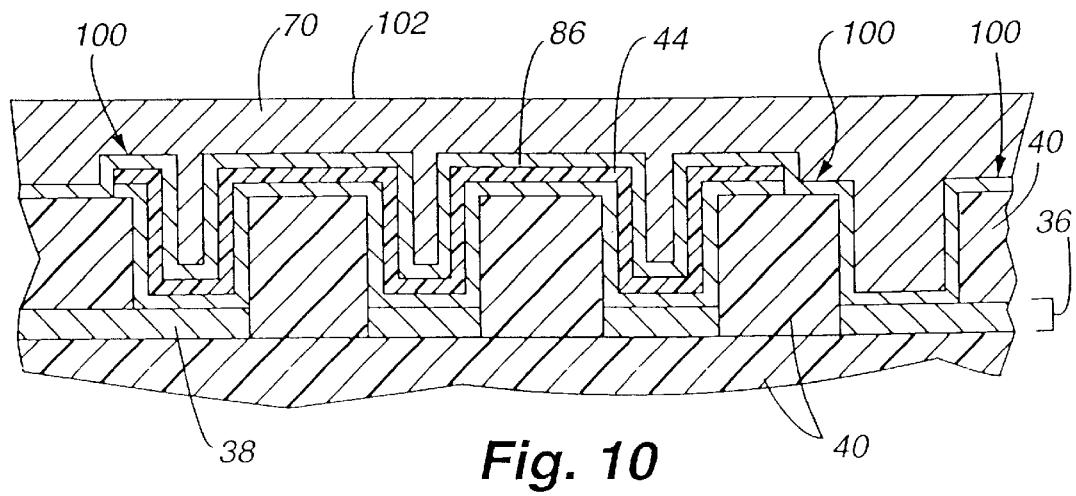

The open interior spaces within the U-shaped portions of the metal layer 100 are filled with plug material 70, as shown in FIG. 10. The insertion of the plug material 70 in the open interior space is an optional step because the metal layer 100 may completely fill the openings 92 and the via 94. An upper surface 102 of the plug material 70 may be reduced using CMP if desired.

Figure 11:
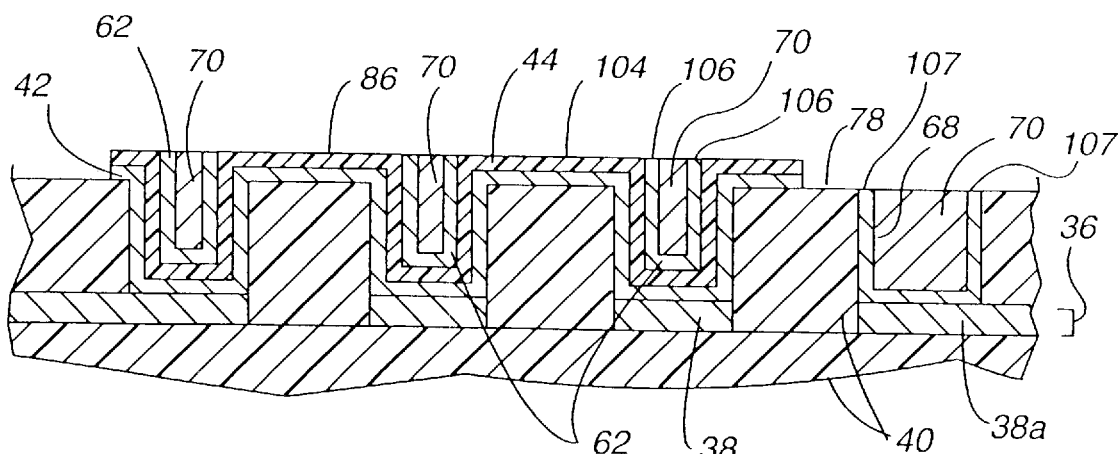

The upper surface 102 of the plug material 70 and the horizontal portions of the metal layer 100 (FIG. 10) are then simultaneously reduced to a coplanar level with an upper surface 86 and a coplanar, lower surface 78 of the interlayer dielectric 40 as shown in FIG. 11. Preferably, the removal of these materials is done with an etch back process step without using a CMP process step. Alternatively, the upper surface 102 of the plug material 70 and the horizontal portions of the metal layer 100 may initially be chemical-mechanically polished to a coplanar level with an upper surface 86 and thereafter, using an etch back process step, the remaining horizontal portion of the layer 100 may then be removed, exposing the surface 78 as shown in FIG. 11. However, this alternative combination of the CMP process step with the etch back step is not preferred since the CMP may substantially remove the capacitor dielectric 44. Moreover, since the etch back process step is required to completely remove the excess metal of layer 100 following the CMP step, the presently preferred method omits the CMP step.

The etch back process step divides the metal layer 100 into the U-shaped upper portions 62 and the U-shaped layer 68. Upper edges 106 of the upper portions 62 are coplanar with the upper surface 86 of the capacitor dielectric 44 and the upper edges 107 of the U-shaped via layer 68 are flush with the upper surface 78 of the interlayer dielectric 40. Since the plug material 70 occupies the open interior within the U-shaped plate portions 62 and the U-shaped via layer 68, the etch back process can be used without concern for residual materials accumulating in those openings.

Figure 12:
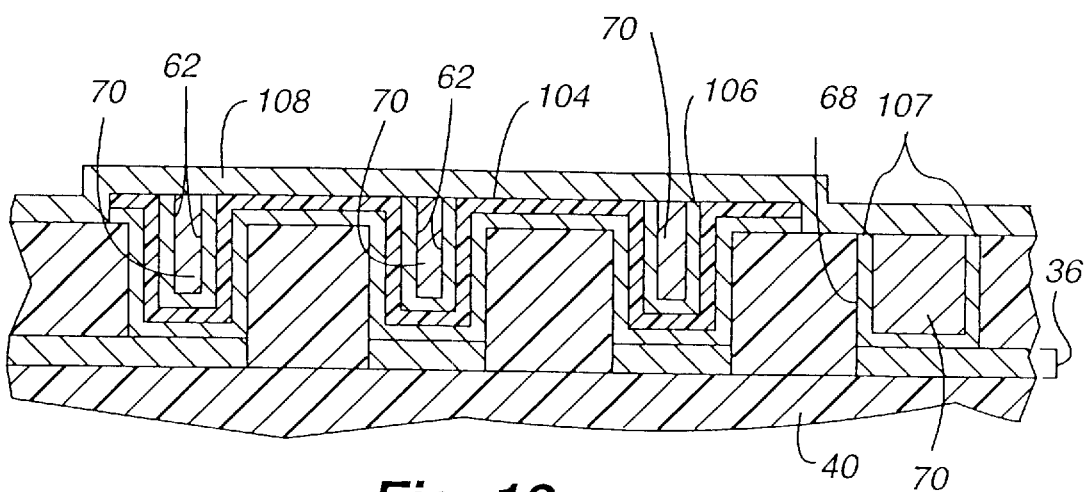

Following the etch back process step, a layer 108 of metal is deposited on the upper surfaces 78 and 86 and on upper ends 106 and 107 of the U-shaped plate portions 62 and metal layer 68, as shown in FIG. 12. The layer 108 is preferably made of some of the same metal material as is used in creating the metal layer 100 (FIG. 10) thereby creating sound electrical connections between the exposed upper ends 106 and 107 of the U-shaped plate portions 62 and the U-shaped layer 68, respectively.

In either the case where the layer 108 is eventually patterned to form one or more conductors 38 of the interconnect layer 36 (FIG. 1), or where the layer 108 eventually connects to one of the conductors 38 of the interconnect layer 36, the layer 108 may be formed in multiple separate layers such as are shown in FIG. 2. Forming the layer 108 in the separate layers such as shown in FIG. 2 enhances its ability to connect with and be compatible with other interconnect conductors 38.

Figure 13:
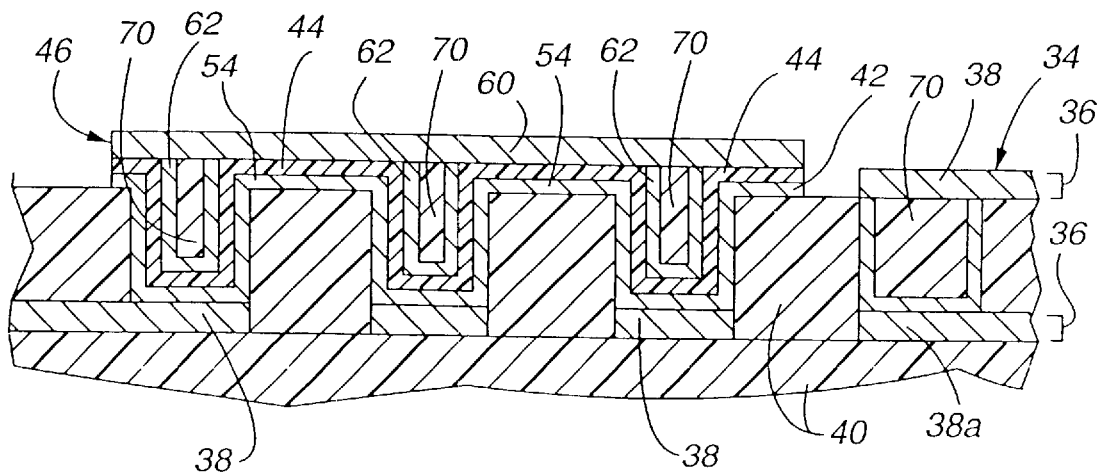

After the layer 108 is formed, preferably by sputtering, PECVD, CVD, or other physical vapor deposition technique, a photolithographic/etch step is used to pattern the layer 108 (FIG. 12) into the interconnect conductor 38 at the via plug interconnect 34 and into the connection segment 60, as shown in FIG. 13. The etch process also disconnects the connection segment 60 from the interconnect conductor 38 which is connected to the via plug interconnect 34. The connection segment 60 in combination with the U-shaped plate portions 62 form the upper plate 46 of the capacitor 32 (FIG. 1). Also the connection segment 60 interacts with the horizontal portions 54 of the lower plate 42 to create the upper horizontal plate capacitor portion of the capacitor structure 32.

Thereafter, the interlayer dielectric material 40 (FIG. 1) is added above the capacitor structure 32 and via plug interconnect structure 34. Additional layers 36 of interconnect conductors and capacitor structures 32 and via plug interconnect structures 34 may be formed in the same manner described to complete the IC 30.

The capacitor structure 200 shown in FIG. 14 is another embodiment of the present invention. The capacitor structure 200 is similar to the capacitor structure 32 shown in FIG. 1, but the capacitor structure 200 adds additional upper U-shaped plate portions 62a to achieve an even greater capacitance with respect to the existing number and size of lower U-shaped plates portions 52. The capacitor 200 is also formed in the interlayer dielectric material 40 and is connected to and between the interconnect conductors 38 of two relatively vertically positioned interconnect layers 36. The lower U-shaped plate portions 52 are electrically connected to the relatively lower interconnect conductors 38, and the upper U-shaped plate portions 62 and 62a are electrically connected to the conductors of the relatively upper interconnect layer 36, thus forming the lower and upper plates 42 and 46, respectively.

The additional upper plate portions 62a are positioned in the horizontal spaces between the existing lower plate portions 52. The additional upper plate portions 62 are electrically connected to the upper connection segment 60 along with the other upper plate portions 62. Interlayer dielectric material 40 completely separates the lower plate portions 52 from the additional upper plate portions 62a. The additional upper plate portions 62a interact with the horizontally-adjacent lower plate portions 52 to create a charge differential between each other, just as the plate portions 52 and 62 interact with each other. The additional upper plate portions 62a increase the capacitance available from the capacitor structure 200 compared to the capacitor structure 32 (FIG. 1). Since the additional capacitance is created primarily between the additional upper plate portions 62a and the horizontally separated existing lower plate portions 52 the additional upper plate portions 62a preferably extend downward into the dielectric material 40 to a position adjacent the lower horizontal portion of the U-shaped portions 52.

The via plug interconnect 34 shown with the capacitor structure 200 in FIG. 14 is structurally the same as the via plug interconnect shown and described above with respect to FIGS. 1–13.

Figure 15:
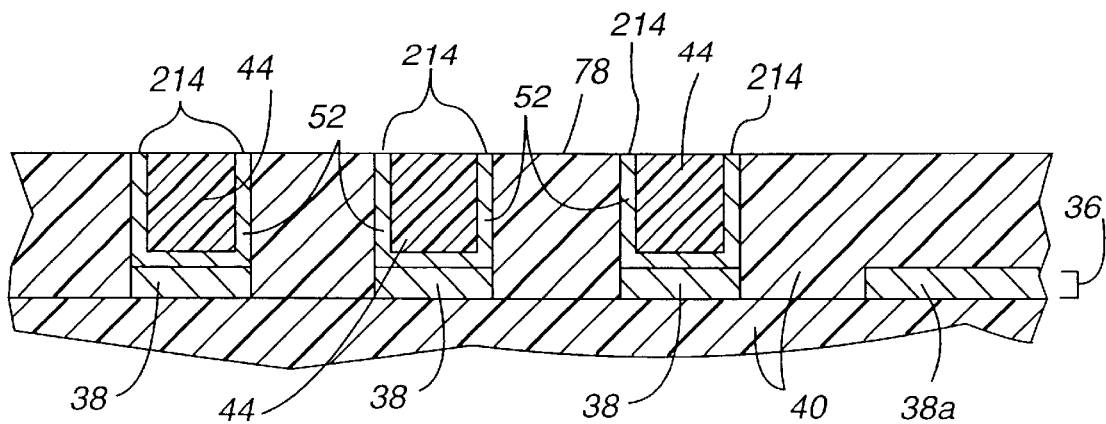
FIGS. 15–22 are cross-sectional views showing the sequence of steps involved in fabricating the capacitor, via plug interconnect and interconnect layer conductors shown in FIG. 14, according to the present invention.

Forming the capacitor structure 200 begins with the same process steps described above with respect to FIGS. 3–6. Beginning with the configuration shown in FIG. 6, CMP is used to remove the capacitor dielectric material 44 and the horizontal portions 54 of the layer of metal forming the undulating lower plate 42, leaving the structure shown in FIG. 15. The CMP creates a planar upper level surface 78 on the interlayer dielectric material 40. The CMP creates the separate U-shaped lower plate portions 52 having upper edges 214 which are flush with the surface 78.

Figure 16:
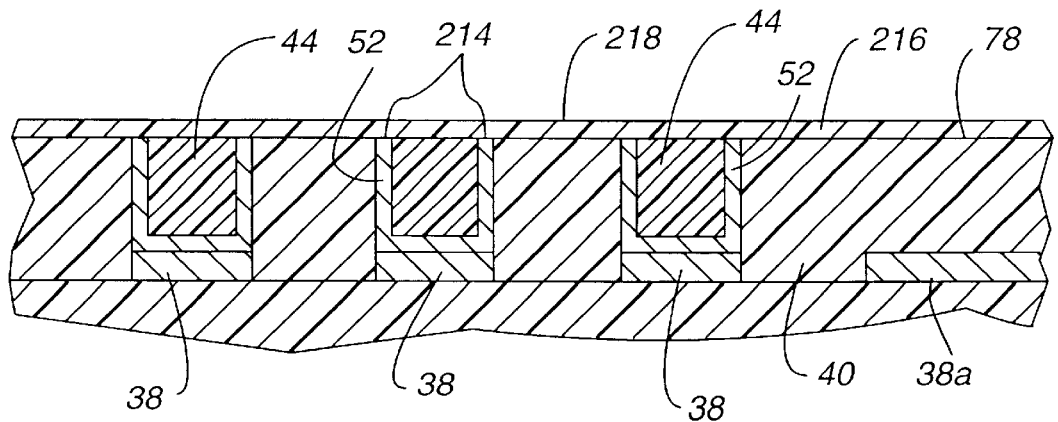

Next, as shown in FIG. 16, a layer 216 of dielectric material is deposited on the upper level surface 78. The material of the layer 216 may be interlayer dielectric material 40, capacitor dielectric material 44 or some other isolation-type dielectric material. Layer 216 of dielectric material covers the upper edges 214 of the U-shaped plate portions 52. The deposition process may result in an uneven upper surface, and CMP may be used to level an upper surface 218 of the layer 216.

Figure 17:
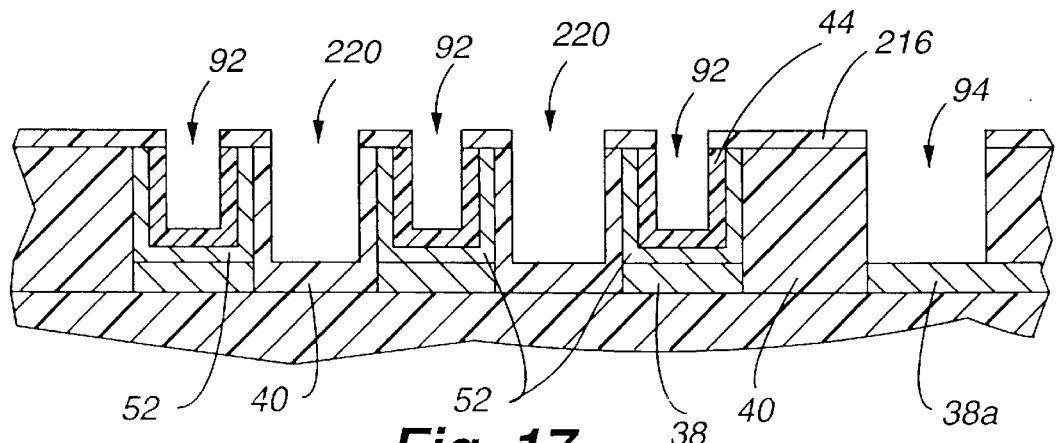

Once the layer 216 of dielectric material is deposited on the upper surface 78, the process flow continues as shown in FIG. 17 with a via photolithographic/etch step, similar to that described above in connection with FIG. 8, simultaneously creating openings 92, 94 and 220. The depths of the openings 220 are substantially equal and approximately the same as the depth of via 94. In essence, this depth is defined by the length of time of the etch process as required to satisfactorily etch the via 94. Preferably, an etch stop layer is formed in the capacitor dielectric material 44 within the interior opening of the lower plate portions 52, in the manner shown and described in FIG. 6 so that the openings 92 may be formed simultaneously with the openings 202 and 94. Without the etch stop layer, the etch process most likely would expose the lower horizontal portion of the U-shaped portion 52. Although possible, an etch stop layer is preferably not used in creating the openings 220.

The openings 92, 94 and 220 can alternatively be formed using a combination of two sequential photolithographic/etch steps as discussed above with respect to FIG. 7C. Also, the openings 92 and 94 can be etched using separate photolithographic/etch steps. If separate steps are used, the openings 220 can be etched simultaneously with either openings 92 or 94.

Figure 18:
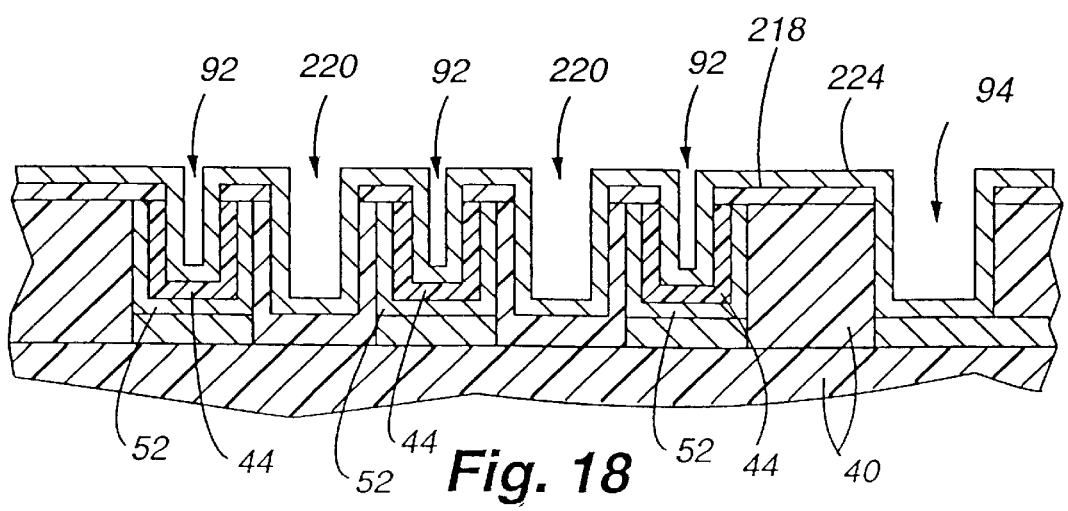

Once the openings 92, 94 and 220 are formed, a metal layer 224 is deposited in the openings 92, 94 and 220, as shown in FIG. 18. The metal layer 224 is deposited on the surfaces of the capacitor dielectric material 44 and the interlayer dielectric material 40. The deposition of the metal layer 224 is performed similarly to the deposition of the metal layer 100 described above in conjunction with FIG. 9, preferably using sputtering, PECVD, CVD, or some other physical vapor deposition technique. The process results in uniformity in thickness of the metal layer 224. The metal of the layer 224 is preferably the same type of metal used as in the lower U-shaped plate portions 52.

Figure 19:
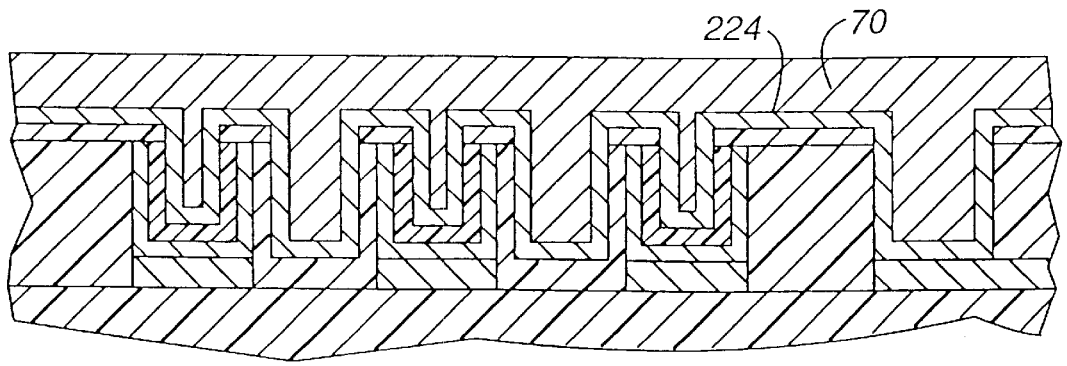
Figure 20:
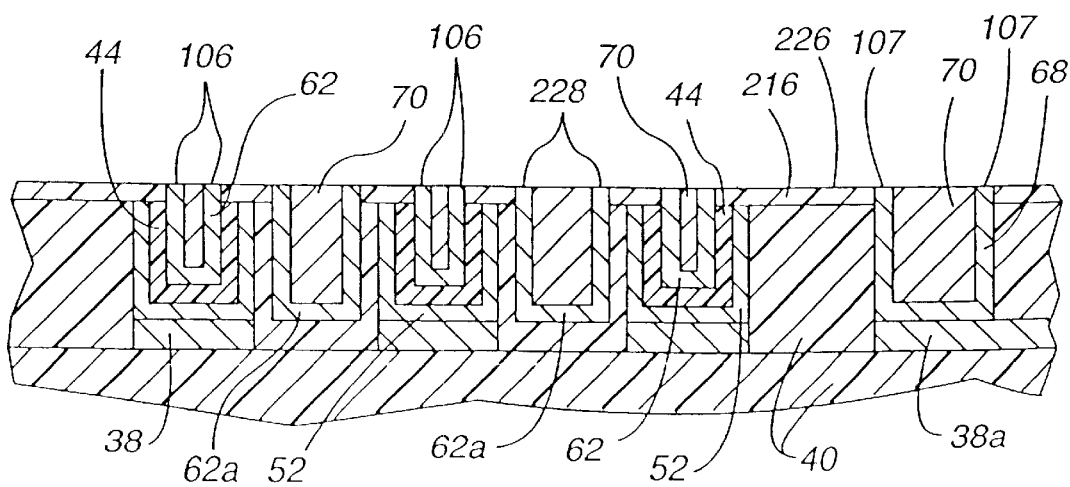

Next, the plug material 70 is deposited in the interior openings of the U-shaped portions of the layer 224, as shown in FIG. 19. The plug material is deposited using conventional PECVD or chemical vapor deposition techniques. The plug material occupies the remaining space of the openings 92, 94 and 220. This step is similar to the step of depositing plug material 70 described in FIG. 10. The plug material 70 and the horizontal portions of the metal layer 224 are then chemically-mechanically polished resulting in a planar upper surface 226 as shown in FIG. 20. The CMP process reduces the height of the planar surface 226 to a predetermined desired thickness of the dielectric material of layer 216 and exposes upper edges 106, 107 and 228 of U-shaped plate portions 62, the U-shaped layer 68, and the additional upper plate portions 62a as well as the plug material 70 within the interior space within these U-shaped structures. The CMP at the step shown in FIG. 20 essentially divides the metal layer 224 (FIG. 19) into the U-shaped portions 62 of the upper plate 46 (FIG. 14), the additional upper plate portions 62a and the U-shaped layer 68 of the via plug interconnect structure 34 (FIG. 14).

Figure 21:
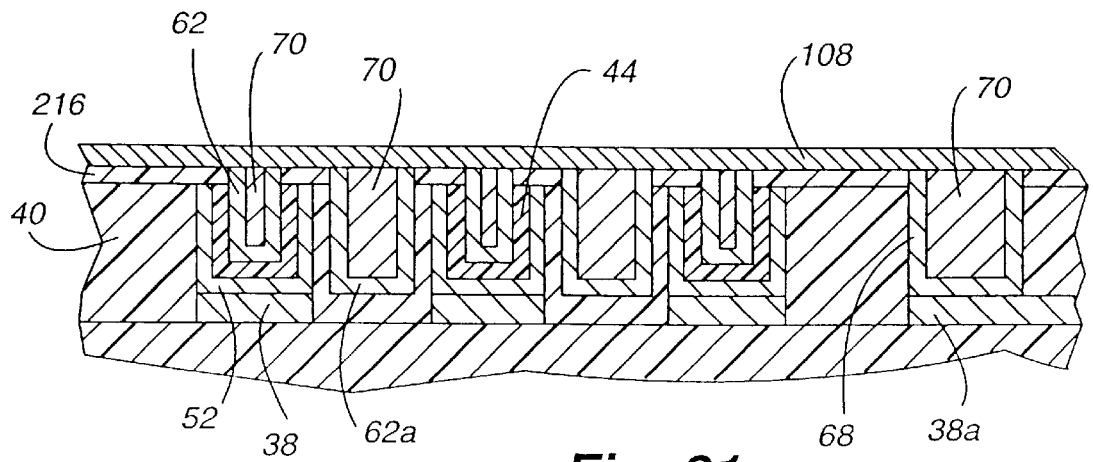
Figure 22:
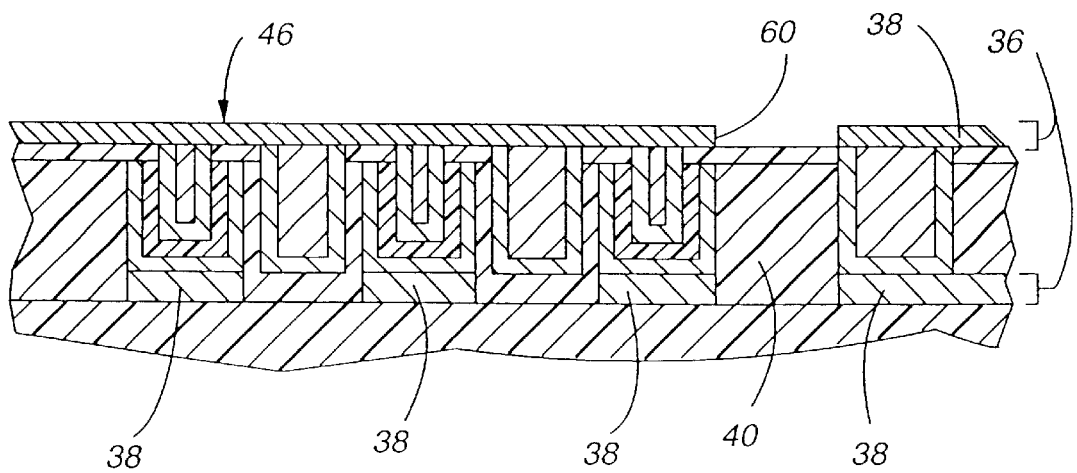

Following the CMP process, the metal layer 108 is applied as shown in FIG. 21, and then the layer 108 is patterned using a photolithographic/etch step as shown in FIG. 22. The metal deposition and photolithographic/etch steps are similar to those steps described above in conjunction with FIGS. 12 and 13. The photolithographic/etch step essentially shapes the metal layer 108 into the connection segment 60 and the interconnect conductors 38 associated with the relatively upper interconnect layer 36. Thereafter, the next layer of interlayer dielectric material 40 (not shown) is formed on top of the interconnect layer 36.

In the same manner and for the same reasons as have been described in connection with FIG. 2, the metal layer 108 formed in the step shown in FIG. 22 can be formed by separate metal layers 72 and 74 (FIG. 2). However for the purposes of simplicity, these separate layers are not shown in FIG. 22.

The capacitor structure 230, shown in FIG. 23, is another embodiment of the present invention. The capacitor 230 is similar to the capacitor 200 except that the lower capacitor plate portions 52 are commonly connected to one connection segment 232. The lower connection segment 232 creates additional capacitance between the additional upper plate portions 62a and the connection segment 232. The process flow involved with forming the capacitor 230 is the same as that in forming the capacitor 200 with two exceptions. First, the step of patterning of the lower interconnect conductors 38 is modified so that the one connection segment 232 is formed, rather than the separate and separated interconnect conductors 38 connected to each lower plate 42 as shown in FIGS. 1 and 14.

Second, the etching process used to form the openings 220 (FIG. 17) is controlled to ensure that the desired amount of interlayer dielectric material 40 separates the lower portion of the additional upper plate portions 62a from the metal of the connection segment 232, thereby helping to establish further additional capacitance between the additional upper plate portions 62a and the lower connection segment 232.

Controlling the depth of openings 220 can be achieved in several ways. One method would involve etching the openings 92, 94 and 220 in their own separate step. Another method involves etching openings 220 simultaneously with openings 92 since the openings 92 and 220 are approximately the same depth. Yet another method involves using a photolithographic/etch step to remove substantially all the material 40 located between separate U-shaped portions 52 (FIG. 16) and then redepositing the dielectric material 40. However, while depositing the material 40, an etch stop layer is formed in the material 40 as described above in conjunction with FIG. 6. Once the etch stop layer is formed in the dielectric material 40 between the separate U-shaped portions 52, a subsequent CMP process step is used to remove excess dielectric material formed above the U-shaped portions 52. Preferably, the CMP process step exposes the upper ends of the U-shaped portions 52 and is followed by another dielectric deposition step. If an etch stop layer is formed within the capacitor dielectric material 44 as discussed above with respect to FIG. 6, all openings 92, 94 and 220 may be etched simultaneously. The etch stop layers will prevent over-etching of openings 92 and 220 so that the timing of the etch process can be defined by the time needed to completely etch the via 94.

Figure 24A:
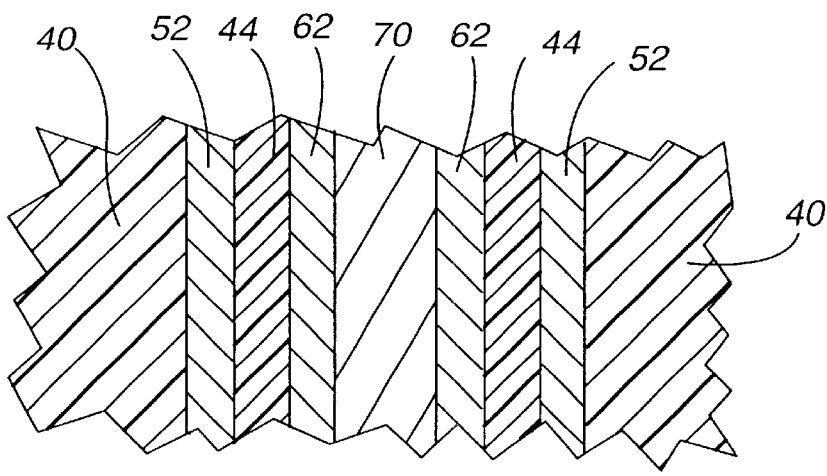
FIGS. 24A–24C are alternate embodiments of top views of the capacitor shown in FIG. 1 taken substantially in the plane of 24—24 shown in FIG. 1.
Figure 24B:
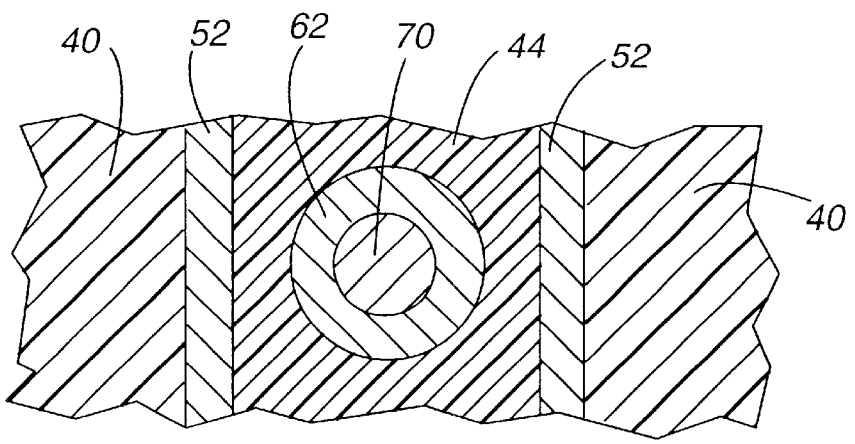
Figure 24C:
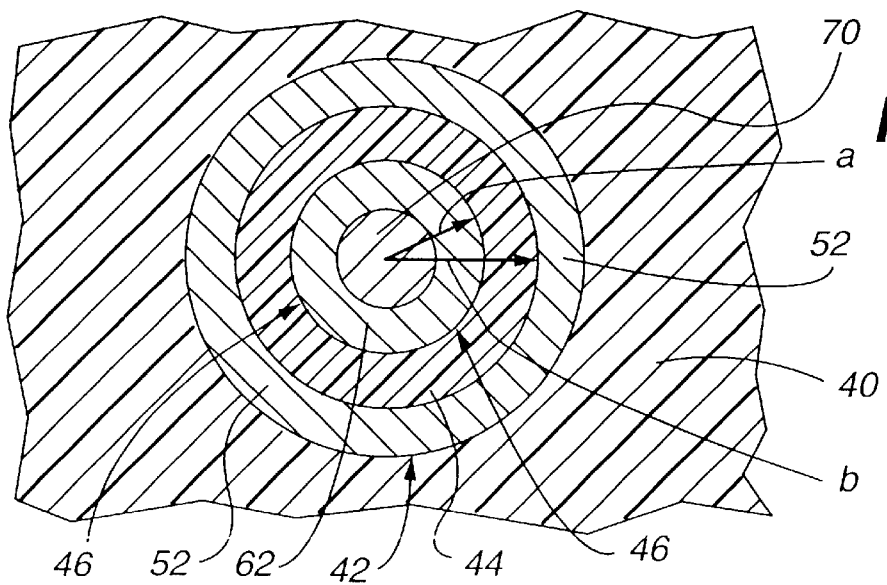

The capacitor 32 shown in FIG. 1 may be formed in elongated rectangular trenches as understood from FIG. 24A. The U-shaped plate portions 62 of the upper plate 46 and lower plate 42 form a parallel plate capacitor. Alternatively, the capacitor 32 may comprise cylindrical (circular in cross section) U-shaped portions 62 positioned between and within the elongated rectangular lower plate portions 52 as shown in FIG. 24B. Also, as shown in FIG. 24C, cylindrical upper U-shaped plate portions 62 also allow the U-shaped lower portions 52 of the lower plate 42 to be formed in a cylindrical shape. The capacitor dielectric 44 conforms and fills the space between the various upper plate and lower plate structures of FIGS. 24A–24C. The capacitor structures 200 and 230 can also be formed into arrangements similar to those shown in FIGS. 24A–24C, if desired.

The capacitor structure shown in FIG. 24C is preferred since relatively high levels of capacitance may be achieved using this structure. In essence, the capacitance is dependent on the ratio of the radius b of the outer material 42 to the radius a of the inner material 46. The capacitance, "C" of a cylindrical capacitor is given by the following equation wherein "L" is the length or depth of the capacitor and $\epsilon_0$ is the dielectric constant of the dielectric material 44:

$$C = \frac{2\pi\epsilon_0 L}{\ln(b/a)}$$

The equation demonstrates that as the thickness of the dielectric material 44 decreases, the capacitance substantially increases due to the inverse logarithmic relationship.

Figure 25A:
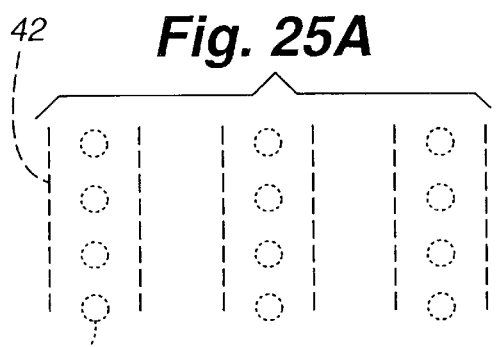
FIGS. 25A–25D are top views of the capacitor shown in FIG. 1, each depicting an alternative embodiment, taken substantially in the plane of 25—25 shown in FIG. 1.
Figure 25B:
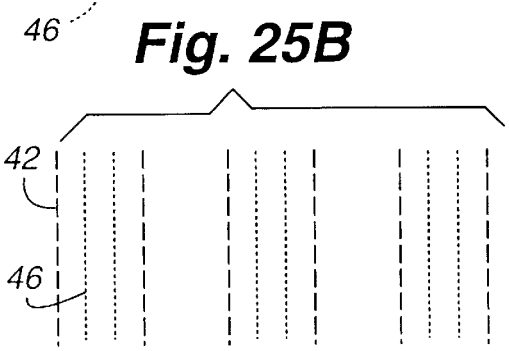
Figure 25C:
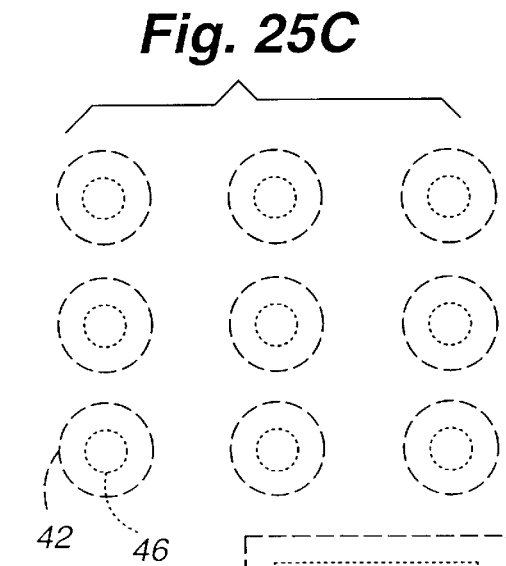
Figure 25D:
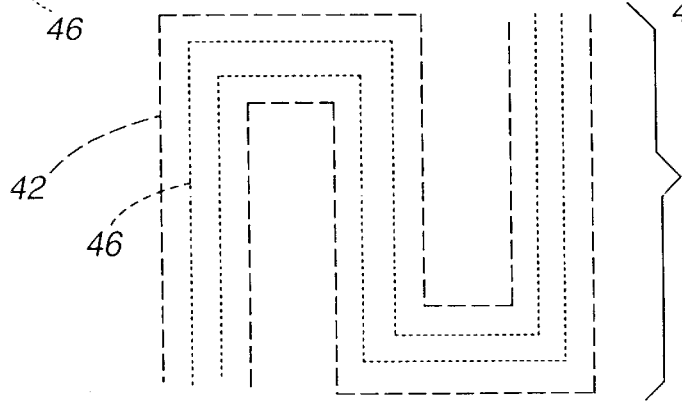

The various arrangements of the capacitor structures shown in FIGS. 24A–24C can further be organized into layout patterns and configurations such as those shown in FIGS. 25A–25D. For ease of representation, long dashed lines are used to outline the positions of the U-shaped portions 52 of the lower plate 42 and short dashed lines are used to outline the positions of the U-shaped portions 62 of the upper plate 46, respectively, of the capacitor structure 32 shown in FIG. 1. FIG. 25A shows a lower elongated plate 42 within which upper cylindrical plates 46 are spaced along its length. FIG. 25B shows lower and upper elongated plates 42 and 46, respectively. FIG. 25C shows cylindrical or oval shaped lower and upper capacitor plates 42 and 46, respectively. FIG. 25D shows a single elongated capacitor formed by a serpentine-like elongated upper and lower plate 46 and 42, respectively.

Figure 26A:
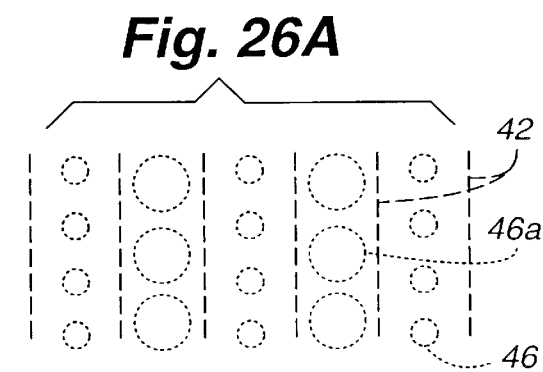
FIGS. 26A–26C are top views of the capacitor shown in FIG. 14, each depicting an alternative embodiment, taken substantially in the plane of 26—26 shown in FIG. 14.
Figure 26B:
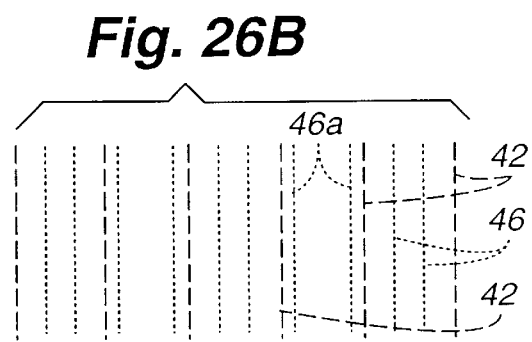
Figure 26C:
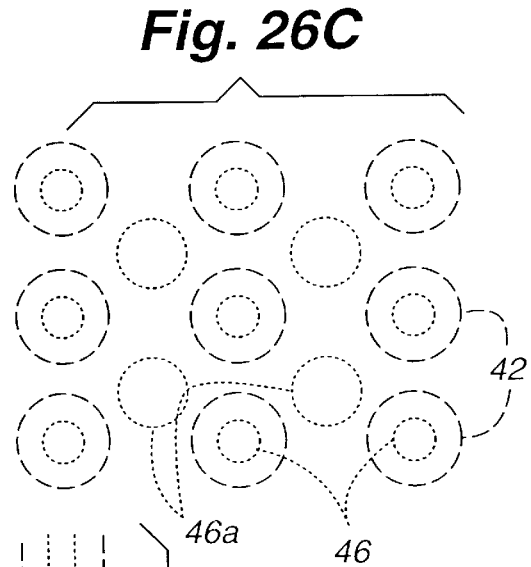

Using the same convention of long and short dashes for description purposes, examples layouts of the capacitor structures 200 and 230 are shown in FIGS. 26A–26C. FIG. 26A illustrates a lower elongated plate 42 with upper plates 46 positioned within the interior of the lower plate 42 and with the additional upper plates 46a positioned in parallel between adjoining lower rectangular plates 42. FIG. 26B discloses elongated parallel upper and lower rectangular plates 46 and 42, respectively, with a separate additional upper plate 46a positioned between the lower plates in parallel relationship thereto. FIG. 26C shows rows of concentrically positioned upper and lower cylindrical plates 46 and 42, with a row of additional upper plates 46a positioned between the lower plates 42.

Many other types of configurations are available to maximize the use of the available space in the interlayer dielectric between the interconnect layers. The vertical orientation of the portions of the capacitor plates further maximizes the capacity effect relative to the horizontal surface consumed. The CMP steps in forming the capacitor structures 32, 200 and 230 do not occur when an opening is available to accumulate and collect residual materials which would otherwise diminish, destroy or poison the subsequent fabrication steps. The amount of space consumed by the capacitor or other vertical component in the IC is minimized and the process steps used are compatible with other process steps used to fabricate the IC. Many other advantages and improvements will be apparent after the present invention is fully comprehended.

Presently preferred embodiments of the present invention have been shown and described with a degree of particularity. These descriptions are of preferred examples of the invention. In distinction to its preferred examples, it should be understood that the scope of the present invention is defined by the scope of the following claims, which should not necessarily be limited to the detailed description of the preferred embodiments set forth above.

The invention claimed is:

1. A substantially vertical interdigitated plate capacitor formed in interlayer dielectric material between a relatively upper generally horizontally extending interconnect layer and a relatively lower generally horizontally extending interconnect layer in an integrated circuit, each interconnect layer comprising a plurality of interconnect conductors, said capacitor comprising:

upper and lower capacitor plates;

capacitor dielectric material separating the plates;

the upper plate has at least one U-shaped portion with vertically extending legs and a horizontal portion connected to an upper edge of each vertically extending leg;

the lower plate has at least one U-shaped portion with vertically extending legs and a horizontal portion connected to an upper edge of each vertically extending leg; and wherein:

a majority of the capacitance of said capacitor is formed by the vertically extending legs of the lower plate and at least one vertically extending portion of the upper plate; and the horizontal portion of the upper plate is a part of one of the interconnect conductors of the relatively upper interconnect layer.

2. A capacitor as defined in claim 1 wherein:

the U-shaped portion of the upper plate is located within the interior of the U-shaped portion of the lower plate.

3. A capacitor as defined in claim 2 wherein the integrated circuit further includes a via connection having a U-shaped layer extending between the interconnect conductors of the relatively upper and relatively lower interconnect layers, and the U-shaped layer of the via connection is formed with at least one same material as and simultaneously with one of the U-shaped portions of the capacitor plates.

4. A capacitor as defined in claim 3 further comprising plug material located within the interior of the U-shaped portion of the upper plate and the U-shaped layer of the via connection.

5. A capacitor as defined in claim 1 wherein the lower plate connects to an interconnect conductor of a relatively lower interconnect layer.

6. A capacitor as defined in claim 5 wherein the U-shaped portion of the lower plate contacts the interconnect conductor of the relatively lower interconnect layer.

7. A capacitor as defined in claim 5 wherein each plate is formed of metal.

8. A capacitor as defined in claim 7 wherein the conductors of the interconnect layers are formed of metal, and of at least some of the metal from which the interconnect layers are formed is the same as the metal from which the plates are formed.

9. A capacitor as defined in claim 5 wherein the integrated circuit includes a substrate, and the conductors of the relatively upper and lower interconnect layers are each spaced from the substrate by dielectric material.

10. A capacitor as defined in claim 2 wherein the upper plate is circular in cross section.

11. A capacitor as defined in claim 10 wherein the lower plate is circular in cross section, and the upper plate is located within the interior of the lower plate.

12. A capacitor as defined in claim 10 wherein the lower plate has an elongated U-shaped trench shape, and the U-shaped portions of the upper plate are located within the interior of the U-shaped trench.

13. A capacitor as defined in claim 2 wherein the upper and lower plates both have an elongated U-shaped trench shape, and the elongated U-shaped trench of the upper plate is located within the interior of the elongated U-shaped trench of the lower plate.

14. A capacitor as defined in claim 2 wherein a substantial majority of a surface area of both plates is formed by the vertically extending legs of each U-shaped portion of each plate.

15. A substantially vertical interdigitated plate capacitor formed in interlayer dielectric material between an upper interconnect layer and a lower interconnect layer in an integrated circuit, each interconnect layer comprising a plurality of conductors, said capacitor comprising:

upper and lower capacitor plates, the upper and lower plates each have a plurality of horizontally-displaced U-shaped portions with vertically extending legs, the U-shaped portion of the upper plate located within the U-shaped portion of the lower plate, the U-shaped portions of the lower plate separated from one another by a horizontal space, the upper plate further including a horizontal connection segment extending through the horizontal space and connecting to the horizontally-displaced U-shaped portions of the upper plate;

capacitor dielectric material separating the upper and lower plates; and a plurality of additional U-shaped portions connected to the horizontal connection segment and positioned between the vertical legs of the U-shaped portions of the lower plate.

16. A capacitor as defined in claim 15 further comprising plug material located within the interior of the U-shaped portions and the additional U-shaped portions of the upper plate.

17. A capacitor as defined in claim 15 wherein the horizontal connection segment of the upper plate connects to a conductor of a relatively upper interconnect layer and at least one U-shaped portion of the lower plate connects to a conductor of a relatively lower interconnect layer.

18. A capacitor as defined in claim 17 wherein each plate is formed of metal, each conductor of the relatively upper and relatively lower interconnect layers is formed of metal, and at least some of the metal from which the interconnect layers are formed is the same as the metal from which the plates are formed.

19. A capacitor as defined in claim 17 wherein the integrated circuit includes a substrate, and the conductors of the relatively upper and lower interconnect layers are each spaced from the substrate and from one another by interlayer dielectric material, interlayer dielectric material occupies the horizontal space between the U-shaped portions of the lower plate, and the additional U-shaped portions are separated from the vertical legs of the U-shaped portions of the lower plate by interlayer dielectric material.

20. A capacitor as defined in claim 17 wherein all of the U-shaped portions of the lower plate are commonly connected to a conductor of the relatively lower interconnect layer, and each additional U-shaped portion includes a horizontal lower segment extending between vertical legs, interlayer dielectric material separates the horizontal lower segment of the additional U-shaped portions and the conductor of the relatively lower interconnect layer which commonly connects the U-shaped portions of the lower plate, and the horizontal lower segment of each additional U-shaped portion and the conductor of the relatively lower interconnect layer create a horizontal parallel plate capacitance.

21. A capacitor as defined in claim 15 wherein the integrated circuit further includes a via connection having a U-shaped layer extending between the conductors of the relatively upper and relatively lower interconnect layers, and the U-shaped layer of the via connection is formed with at least one same material as and simultaneously with one of the U-shaped portions of the capacitor plates.

22. A capacitor as defined in claim 15 wherein a substantial majority of a surface area of both plates is formed by the vertically extending legs of each U-shaped portion of each plate.

* * * * *